(12) United States Patent
Crespi et al.

(10) Patent No.: US 7,952,508 B2
(45) Date of Patent: May 31, 2011

(54) NOISE-SHAPED SCRAMBLER FOR REDUCED OUT-OF-BAND COMMON-MODE INTERFERENCE

(75) Inventors: Lorenzo Crespi, Costa Mesa, CA (US); Ketan B Patel, Lake Forest, CA (US); Kyehyung Lee, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 84 days.

(21) Appl. No.: 12/553,004

(22) Filed: Sep. 2, 2009

(65) Prior Publication Data

US 2011/0050467 A1   Mar. 3, 2011

(51) Int. Cl.
*H03M 1/66* (2006.01)
(52) U.S. Cl. .......................................... 341/152; 341/53
(58) Field of Classification Search .................... 341/53, 341/143, 152; 375/238, 254, 257
See application file for complete search history.

(56) References Cited

U.S. PATENT DOCUMENTS

| | | | |
|---|---|---|---|
| 5,936,856 A | 8/1999 | Xiang | |
| 6,172,633 B1 * | 1/2001 | Rodgers et al. | 341/152 |
| 6,614,297 B2 | 9/2003 | Score et al. | |
| 6,751,105 B2 | 6/2004 | Yamanaka et al. | |
| 6,842,354 B1 | 1/2005 | Tallam | |
| 6,847,257 B2 | 1/2005 | Edwards et al. | |
| 7,215,559 B2 | 5/2007 | Nondahl et al. | |
| 7,248,089 B2 | 7/2007 | Pedersen et al. | |
| 7,561,625 B1 * | 7/2009 | Searles et al. | 375/257 |
| 7,573,732 B2 | 8/2009 | Teichmann et al. | |
| 7,830,280 B2 * | 11/2010 | Bae et al. | 341/58 |
| 2007/0230687 A1 * | 10/2007 | Talbot et al. | 380/28 |
| 2007/0279126 A1 | 12/2007 | Krishnan et al. | |
| 2008/0074907 A1 | 3/2008 | Ritter et al. | |

OTHER PUBLICATIONS

Matamura, Atsushi; Nishimura, Naoaki; Liu, Bill Yang; "Filterless Multi-Level Delta-Sigma Class-D Amplifier for Portable Applications", IEEE, Sep. 2009, pp. 117-1180, Analog Devices K.K., Tokyo, Japan.
Honda, Jun; Adams, Jonathan; "Application Note AN-1071, Class D Audio Amplifier Basics", International Rectifier, Feb. 8, 2005, pp. 1-14, El Segundo, California, United States of America.
"2 W Filterless Class-D Stereo Audio Amplifier, SSM2304", Analog Devices, Dec. 2006, pp. 1-20, Revision 0, Norwood, Massachusetts, United States of America.
"2W Filterless, Class-D Stereo Audio Amplifier, SSM2306", Analog Devices, Apr. 2007, pp. 1-16, Revision 0, Norwood, Massachusetts, United States of America.

* cited by examiner

*Primary Examiner* — Howard Williams
(74) *Attorney, Agent, or Firm* — Jackson Walker L.L.P.; Christopher J. Rourk

(57) ABSTRACT

Class-D amplifiers have evolved from using binary pulse-width modulation (PWM) modulators to three-level PWM modulators. Three-level PWM drivers for audio applications offer the benefits of eliminating costly elements at the output of an audio system. However, they also introduce increased common-mode interference. Three-level PWM generates three states, but one state has two interchangeable representations which can be scrambled in order to shape the common-mode output spectrum.

20 Claims, 17 Drawing Sheets

400

| PWM$_p$ | PWM$_n$ | PWM$_{DM}$ | PWM$_{CM}$ |
|---|---|---|---|
| 0 | 1 | -1 | 0.5 |
| 1 | 0 | +1 | 0.5 |

410

| PWM$_p$ | PWM$_n$ | PWM$_{DM}$ | PWM$_{CM}$ |
|---|---|---|---|
| 0 | 0 | 0 | 0 |
| 0 | 1 | -1 | 0.5 |
| 1 | 0 | +1 | 0.5 |
| 1 | 1 | 0 | 1 |

FIG. 4 (Prior Art)

| $PWM_p$ | $PWM_n$ | $scram_{ctrl}$ | $scram_p$ | $scram_n$ |
|---|---|---|---|---|
| 0 | 0 | 0<br>1 | 0<br>1 | 0<br>1 |
| 0 | 1 | x | 0 | 1 |
| 1 | 0 | x | 1 | 0 |
| 1 | 1 | 0<br>1 | 0<br>1 | 0<br>1 |

FIG. 11A

| $PWM_p$ | $PWM_n$ | $scram_{ctrl}$ | $scram_p$ | $scram_n$ |
|---|---|---|---|---|
| 0 | 0 | 0<br>1 | 0<br>1 | 0<br>1 |
| 0 | 1 | x | 0 | 1 |
| 1 | 0 | x | 1 | 0 |
| 1 | 1 | 0<br>1 | 1<br>0 | 1<br>0 |

FIG. 11B

1610
Audio
Range

NOISE-SHAPED SCRAMBLER FOR REDUCED OUT-OF-BAND COMMON-MODE INTERFERENCE

BACKGROUND OF THE INVENTION

1. Field of the Invention

The present invention relates generally to three-level pulse-width modulation (PWM) modulators and specifically to the reduction of common-mode interference.

2. Related Art

In today's environment, class-D amplifiers are used to provide an integrated solution for applications such as powering audio devices. Class-D amplifiers have advantages in power consumption and size over more traditional analog amplifiers. Generally, they do not require bulky transformers or heat sinks, making them more suitable for integrated circuits.

In particular, the class-D amplifier unlike a traditional amplifier produces an output comprising a sequence of pulses. Typically, these pulses vary in width or in density in methods known as PWM or pulse density modulation (PDM). The average value of these pulses represents the instantaneous amplitude of the output signal. These pulses are also comprise unwanted high-frequency harmonics, which are typically removed by a low-pass filter.

FIG. 1 is a block diagram illustrating the typical architecture of class-D amplifier 100. The input signal is converted to pulses using modulator 102 which can be a pulse-width modulator or a pulse-density modulator. A common implementation of a pulse-width modulator uses a high-speed comparator to compare the input signal against a ramp or triangle wave. The modulated signal is then amplified by amplifier 104 and finally demodulated by low-pass filter 106. The demodulated signal can then be used, for example by speaker 108.

FIG. 2 illustrates a traditional class-D amplifier design using a binary PWM scheme. Pulse modulator 102 produces a PWM signal similar to the description above. The PWM signal drives two half-bridge circuits 206 and 208 with opposite polarities. Each half-bridge circuit performs the amplification. With relation to FIG. 1, amplifier 104 would comprise the two half-bridge circuits. In this example, inverter 202 is used to drive half-bridge circuit 206 whose output is shown as $Hout_p$ and buffer 204 is used to drive half-bridge circuit 208 whose output is shown as $Hout_n$. The outputs of both half-bridge circuits result in a differential output signal that is filtered by low-pass filter 210 and drives load 212.

In power applications, low-pass filter 210 can be comprised of bulky and expensive passive inductors and capacitors. As a result, a recent trend in class-D audio amplifiers has been to advance from traditional binary, two-level PWM operation such as that described in FIG. 2 to a three-level PWM scheme. A three-level modulation scheme relaxes and potentially eliminates the need for external filtering between the amplifier and the load.

FIG. 3 illustrates a class-D amplifier design using a three-level modulation scheme. Modulation circuit 302 generates two outputs $PWM_p$ and $PWM_n$, which drive two half-bridge circuits 308 and 310 through buffers 304 and 306, respectively. Unlike the two-level modulation scheme, $PWM_p$ and $PWM_n$ need not be of opposite polarity. Half-bridge circuit 308 produces output $Hout_p$ and half-bridge circuit 310 produces output $Hout_n$. The result is a differential output signal of $Hout_{DM}=Hout_p-Hout_n$, which optionally can be filtered by low-pass filter 312 and drives load 314. If low-pass filter 312 is used, due to the relaxed need, a less expensive low-pass filter could be used. It should be noted that even though modulation circuit 302 produces outputs with a combination of 4 potential states ([00], [01], [10], & [11]), due to the differential mode of operation, when $PWM_p$ and $PWM_n$ are the same ([00] or [11]) the resulting differential output signal $Hout_{DM}$ is zero. Hence, the output of modulation circuit 302 results in a net output of three differential output states.

FIG. 4 illustrates the outputs of the modulation circuits (or pulse modulators) and the resultant output states for both two-level and three-level modulation schemes. Table 400 shows the logic states for a two-level PWM scheme. The input to half-bridge circuit 206 is shown in the table as $PWM_p$ and the input to half-bridge circuit 208 is shown in the table as $PWM_n$. Because the inputs are logically complementary, when $PWM_p$ is 1, $PWM_n$ is 0, and when $PWM_p$ is 0, $PWM_n$ is 1. The resultant logic is shown as $PWM_{DM}$. $PWM_{DM}$ is related to $Hout_{DM}$ in that $PWM_{DM}$ represents the differential output logic of the pulse-width modulator and $Hout_{DM}$ is the actual differential output voltage of the amplifier. Typically, $Hout_{DM} \propto PWM_{DM} \times (V_{DD}-V_{SS})$. Also shown is a column for $PWM_{CM}$, the common-mode output that will be discussed in greater detail later. Table 410 shows the logic states for a three-level PWM modulation scheme. The input to half-bridge circuit 308 is shown in the table as $PWM_p$ and the input to half-bridge circuit 310 is shown in the table as $PWM_n$. Unlike the two-level modulation scheme, $PWM_p$ and $PWM_n$ are independent in the logical values they can take. The four different combinations are shown in table 410. As previously stated, the four input states result in only three unique differential output logic states ($PWM_{DM}=-1, 0,$ or $+1$). Hence, the design of FIG. 3 is a three-level modulation scheme.

Specifically to the two-level PWM case, FIG. 5 shows an example of signaling when $V_{SS}$ is grounded. The output of pulse modulator 102 is shown as $PWM_{IN}$. In accordance with FIG. 2, the outputs of the each half-bridge circuit are shown as $Hout_p$ and $Hout_n$. As described above, the differential output voltage $Hout_{DM}$ is the difference between the two half-bridge output voltages. The peak-to-peak differential voltage swing can be seen to be $2V_{DD}$. Alternatively, the common-mode output voltage, $Hout_{CM}$, is defined as the average of the two half-bridge output voltages, $Hout_{CM}=\frac{1}{2}(Hout_p+Hout_n)$. Because each half-bridge circuit is driven by logically complementary signals, the common-mode signal is constant and has a magnitude of $\frac{1}{2}V_{DD}$.

While this type of PWM signaling is simple to implement, it has a fundamental drawback. Since the output levels $Hout_p$ and $Hout_n$ are always complimentary, there's always differential load current flowing. As illustrated when the amplifier input is zero, the differential output cannot be zero; it must take on the value of $+V_{DD}$ or $-V_{DD}$. As a result, the amplifier must toggle between $+V_{DD}$ and $-V_{DD}$ with a 50% duty-cycle such that the low-frequency signal averages to a zero output. However, high-frequency switching currents are always present. This results in a large load current flowing even when there's no input. The large switching current results in greater loss in the load and amplifier, consequently reducing its power efficiency. In order to reduce these additional losses, a bulky, expensive output filter is usually required to isolate the speaker load from the high frequency switching current and to shunt any excess current to ground.

In contrast, FIG. 6 shows an example of signaling for the three-level PWM scheme in accordance with the circuit shown in FIG. 3. It should be noted that the primary difference of the three-level scheme compared to the two-level scheme is that each half-bridge driver is controlled independently. In particular, this allows $Hout_p$ and $Hout_n$ to be driven to the same level instead of always being complimentary. As can be seen at intervals 602, 604, 606, 608, 610, 612, and 614, the differential signal is now allowed to go to zero and the transitions are half as large as in the binary case. These improvements drastically lower the switching current and allow the output filter 310 to have significantly relaxed requirements or even be removed altogether.

FIG. 7 highlights the specific case when the input signal is zero. When the input signal is zero, the three-level PWM generator can cause $\text{Hout}_p$ and $\text{Hout}_n$ to take the same value producing a differential output $\text{Hout}_{DM}$ of zero. As mentioned before, a two level PWM scheme must have the differential output $\text{Hout}_{DM}$ switched between $+V_{DD}$ and $-V_{DD}$, typically at the class-D amplifier's switching rate. Since there is no potential across the load in the three-level PWM case, there is no current flowing through the load, further underscoring the possibility of having a filter-free amplifier design.

However, the change to the three-level modulation scheme is accompanied with an increase in common-mode signaling. As seen in FIG. 5, a two-level modulation scheme yields a constant or direct current (DC) common-mode signal $\text{Hout}_{CM}$, steady at $\frac{1}{2}V_{DD}$. On the contrary, as shown in FIG. 6, the three-level modulation scheme has a fluctuating common-mode signal $\text{Hout}_{CM}$. While this common-mode signaling typically has little energy in the audio band and minimally impacts audio performance, it can have a lot of out-of-band energy that is concentrated into narrow bands that extend out to very high frequencies. These strong "spikes" of energy can couple into any circuitry that is placed in close proximity to the amplifier or speaker traces. This is a very common issue due to the miniaturization of electronics such as increasingly smaller laptops, cellular phones, and MP3 players.

It should be noted that the power and fidelity of the audio signal heard by the user are related primarily to the differential signal $\text{Hout}_{DM}$. Any errors or non-idealities in the differential signal can result in increased distortion or noise in the speaker audio signal. On the other hand, while the common-mode signal $\text{Hout}_{CM}$ does not generally affect audio performance, it can result in electromagnetic interference (EMI) and electromagnetic compatibility (EMC) issues with neighboring circuitry.

As an example, FIG. 8 shows long speaker traces 806 and 808 between amplifier 802 and speaker load 804. Any potential external filter is omitted for clarity. Additionally, trace 810 is shown which is connected to some other circuitry that is in close proximity to the speaker traces. Any alternating current flowing through the speaker traces will induce a signal into the adjacent circuitry. This is a particularly significant problem with class-D amplifiers due to the large levels of current being sourced and sunk between the amplifier and the load.

Mathematically, expressions for the coupling between the speaker traces and the adjacent traces can be derived. From the previous definitions, $\text{Hout}_p$ and $\text{Hout}_n$ can be expressed in terms of their differential-mode and common-mode components, specifically, $\text{Hout}_p = +\frac{1}{2}\text{Hout}_{DM} + \text{Hout}_{CM}$ and $\text{Hout}_n = -\frac{1}{2}\text{Hout}_{DM} + \text{Hout}_{CM}$. The voltage coupled from the speaker traces to adjacent node 816 is defined as $V_{emc}$. Define $G_p(f)$ as the coupling transfer function from positive speaker node 812 to adjacent node 816 and $G_n(f)$ as the coupling transfer function from negative speaker node 814 to adjacent node 816. Then the voltage coupled from the speaker nodes to adjacent node 816 is given by $V_{emc} = G_p(f)\text{Hout}_p + G_n(f)\text{Hout}_n = G_p(f)(\frac{1}{2}\text{Hout}_{DM} + \text{Hout}_{CM}) + G_n(f)(-\frac{1}{2}\text{Hout}_{DM} + \text{Hout}_{CM}) = \frac{1}{2}[G_p(f) - G_n(f)]\text{Hout}_{DM}[G_p(f) + G_n(f)]\text{Hout}_{CM}$.

Ideally, if the environment and distance between each speaker trace node and the offended circuitry can be maintained symmetrically (by such methods as careful layout or using twisted cabling), then the coupling transfer functions can be made substantially equal to one another, i.e., $G(f) = G_p(f) = G_n(f)$. Then, $V_{emc} = 2 G(f)\text{Hout}_{CM}$. Thus the amount of voltage induced into the adjacent circuitry is ideally dependent only on the common-mode signaling.

Referring back to the common-mode waveform in FIG. 7, when the amplifier input signal is zero, the output common-mode signal is a square wave with a frequency equal to the class-D amplifier switching frequency. The spectrum of such a signal is shown in FIG. 9. The plot shows strong harmonics at odd multiples of the switching frequency extending out to very high frequencies. Even though the harmonics are outside of the audio band and do not affect the audio quality, these harmonics can easily couple into surrounding circuitry and degrade the impacted circuitry's performance. Thus it is important to reduce these harmonics in order to minimize EMI/EMC issues.

While the three-level PWM modulation scheme potentially allows filter-free differential operation, the accompanying common-mode signaling typically requires its own filtering to reduce the EMI/EMC issues. It is common practice to apply shielding or proper grounding of the end product's case in order to pass regulatory requirements. However, this shielding or grounding may not address interference within the enclosure. To resolve this interference, common-mode filtering via passive inductor-capacitor (LC) filtering is typically required to reduce common-mode harmonics to an acceptable level.

An alternative solution is to use spread-spectrum clocking to spread the out-of-band energy over a wider bandwidth so that the peaks are reduced. This essentially varies the clock's frequency over a band of values such that the class-D amplifier's switching frequency is spread out. The result is a spreading of the out-of-band energy and a reduction of the peaks. However, this also has an impact on the differential signaling. Empirical results have shown that spread-spectrum clocking can affect a class-D amplifier's linearity as well as dynamic range due to increased clock spurs and audio band noise. As a result, strict requirements must be placed on the spread-spectrum generator.

Thus there is a need in the industry for an inexpensive, compact solution that maintains the differential improvements of three-level PWM signaling while attenuating the common-mode harmonics without compromising the audio performance of the class-D amplifier.

SUMMARY OF INVENTION

A class-D amplifier can be implemented with reduced common-mode interference. The class-D amplifier comprises a three-level PWM modulator, an amplifier, and optionally a low-pass filter. The three-level PWM modulator comprises a three-level PWM generator and a common-mode scrambler circuit. Information of the three levels is carried through two signal paths referred to as the p signal and the n signal. For convenience, the inputs and outputs of the common-mode scrambler circuit relating to the p signal and the n signal are referred to as the p input, n input, p output and n output, respectively. The PWM modulator is followed by an amplifier which comprises amplifier components for the p path and the n path and is driven by the p output and the n output of the common-mode scrambler circuit. The amplifier components can comprise a buffer circuit and a half-bridge circuit. The common-mode scrambler circuit passes through unchanged the p and n outputs of the three-level PWM generator when the two outputs are in different states (e.g. one is in the high state and one is in the low state.), but scrambles the p and n outputs based on a scrambler control signal when the p and n outputs are in the same state.

One method of scrambling is to set both the p and n signal to the same value as the scrambler control signal (or equivalently to the inverse of the scrambler control signal). Another method is to invert the p and n signals when the scrambler control signal is in the high state and leave the p and n signals unchanged when the scrambler control signal is in the low state (or vice versa). The scrambling can be controlled by a noise shaping circuit such as a delta-sigma modulator to help shape the common-mode noise.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 4 compares the outputs of the modulation circuits (or pulse modulators) and the resultant output states for both two-level and three-level PWM schemes;

FIG. 11A shows a truth table of the replace mode scrambler logic;

FIG. 11B shows a truth table of the invert mode scrambler logic;

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents, included within the spirit and scope of the disclosure as defined by the appended claims.

Figure 1:
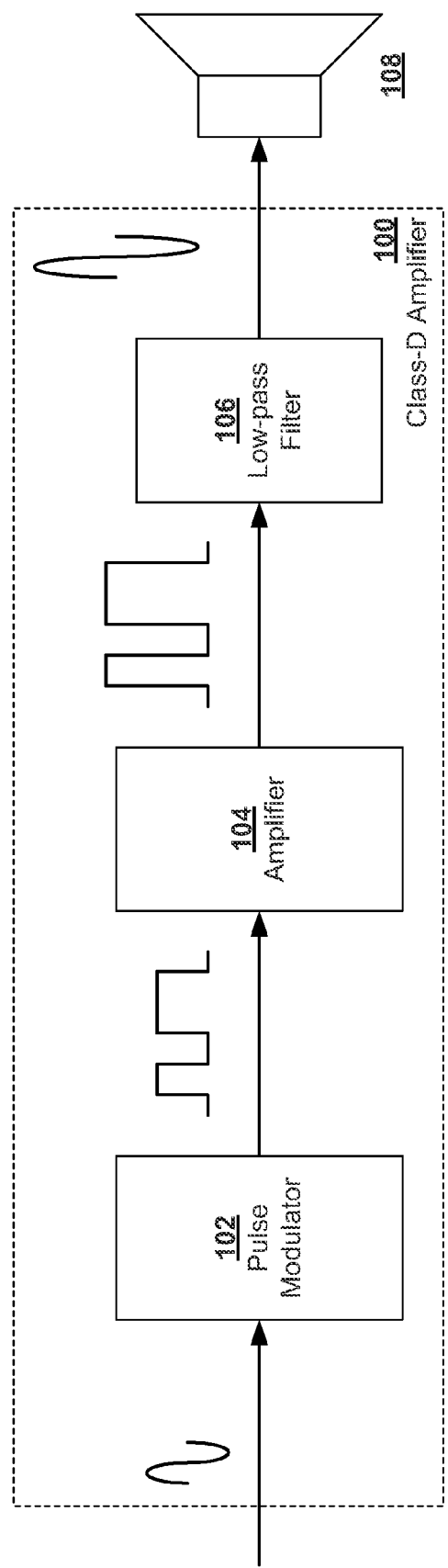
FIG. 1 is a block diagram illustrating the typical architecture of a class-D amplifier.
Figure 2:
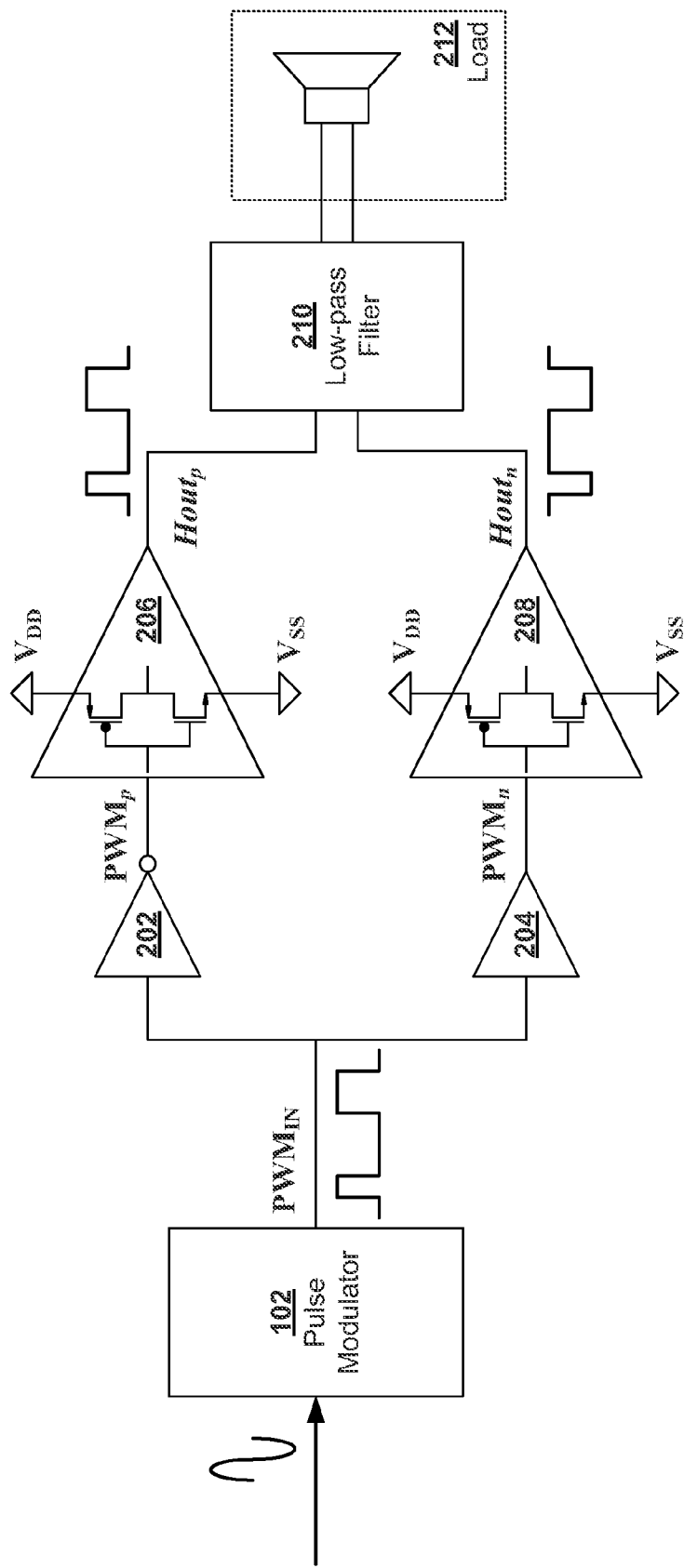
FIG. 2 illustrates a traditional class-D amplifier design using a binary PWM scheme.
Figure 3:
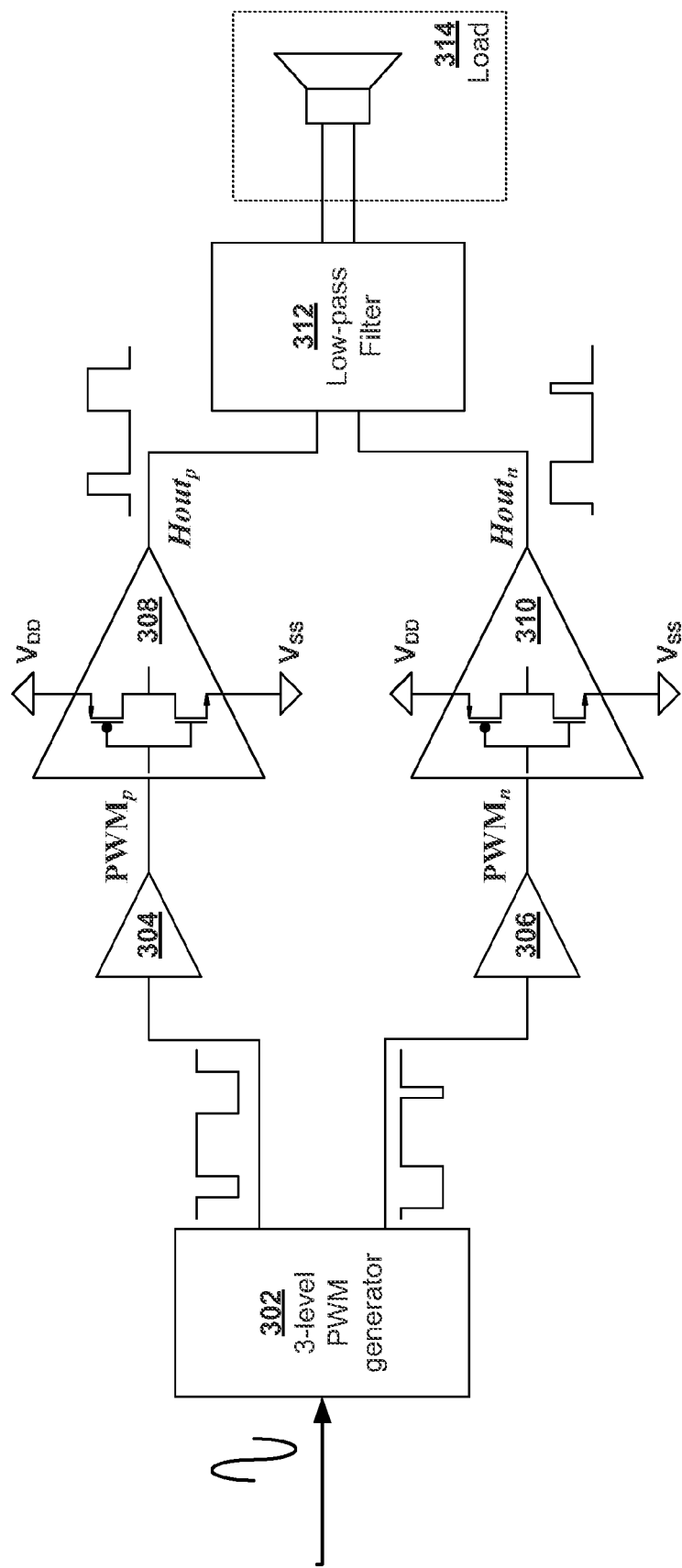
FIG. 3 illustrates a class-D amplifier design using a three-level pulse-width modulation scheme.
Figure 5:
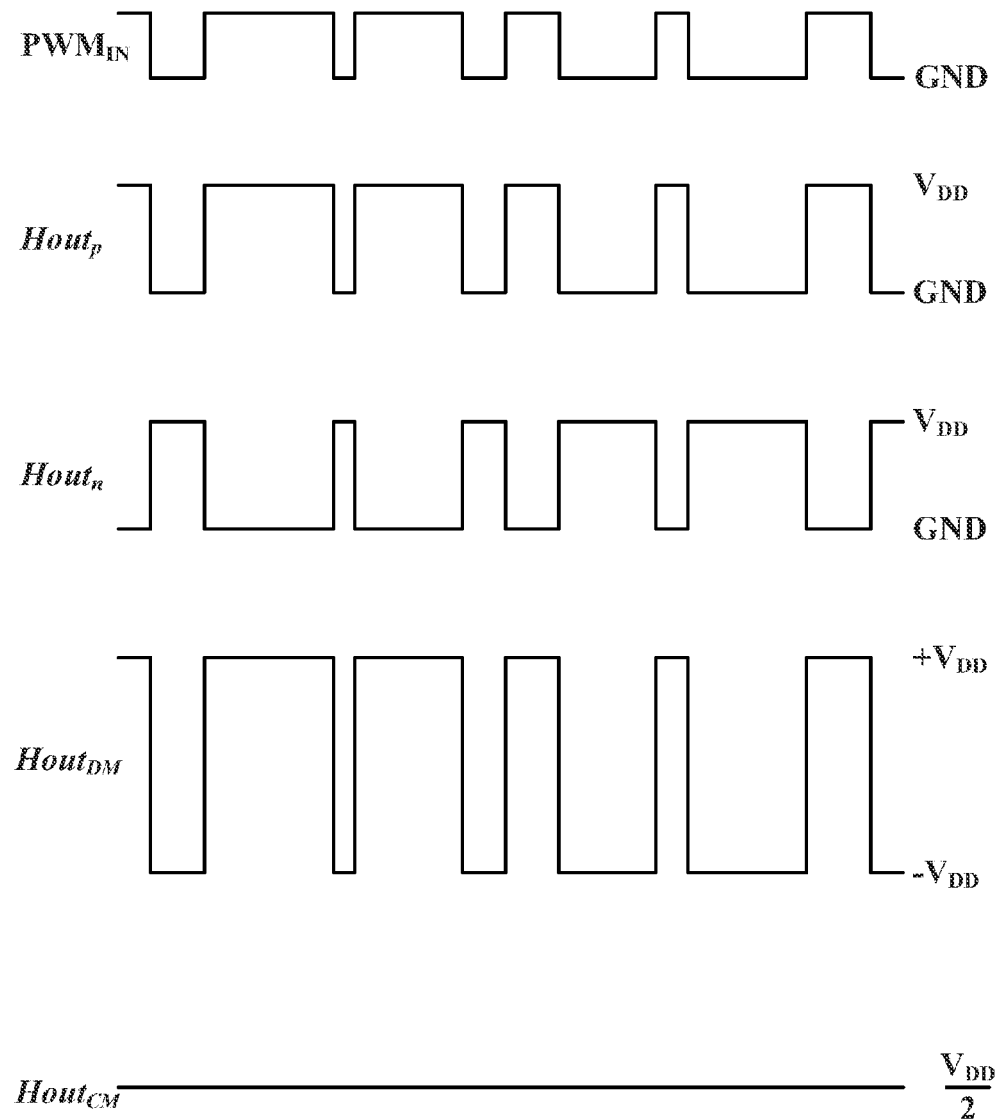
FIG. 5 shows an example two-level PWM signaling scheme.
Figure 6:
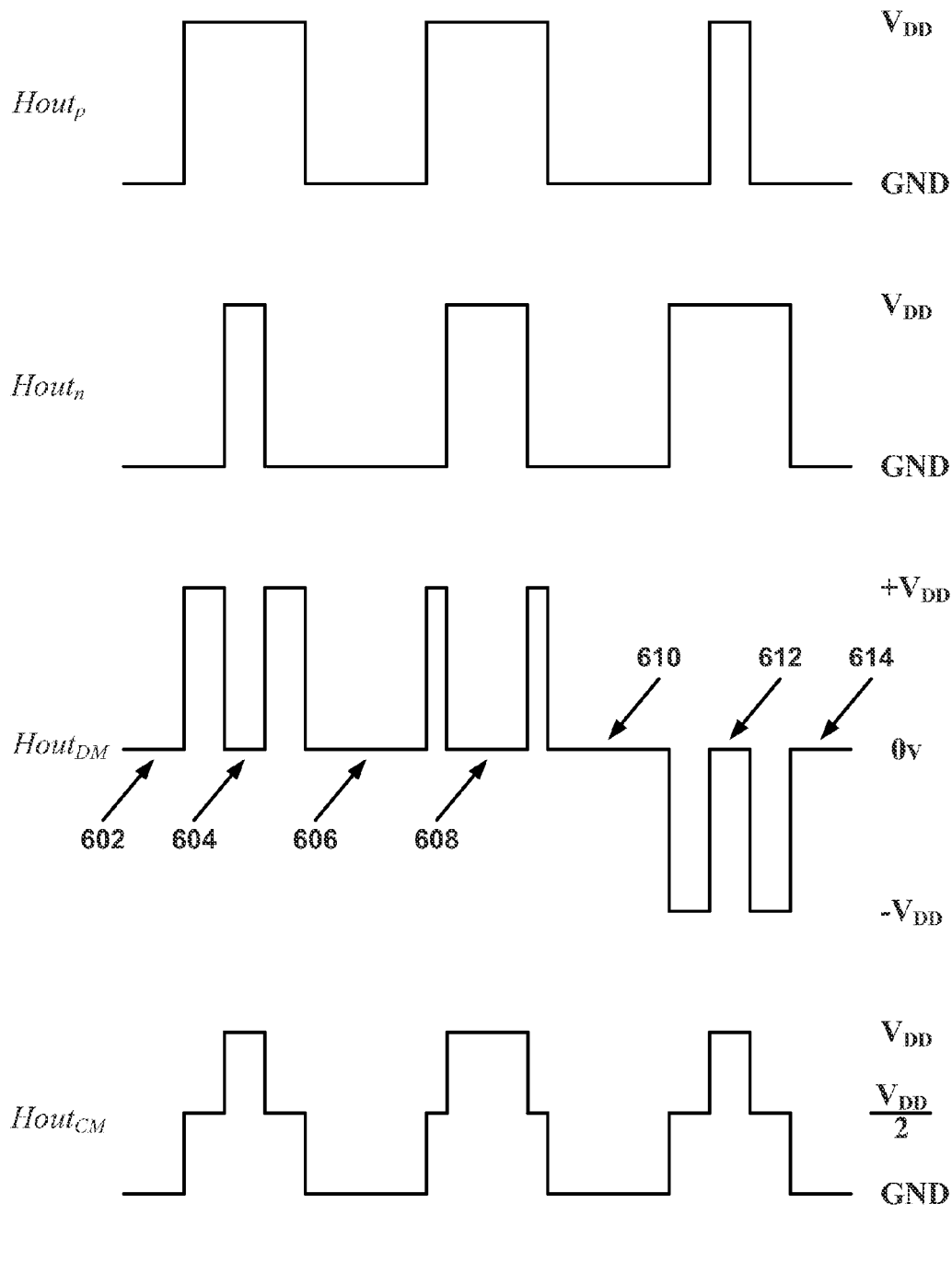
FIG. 6 shows an example three-level PWM signaling scheme.
Figure 7:
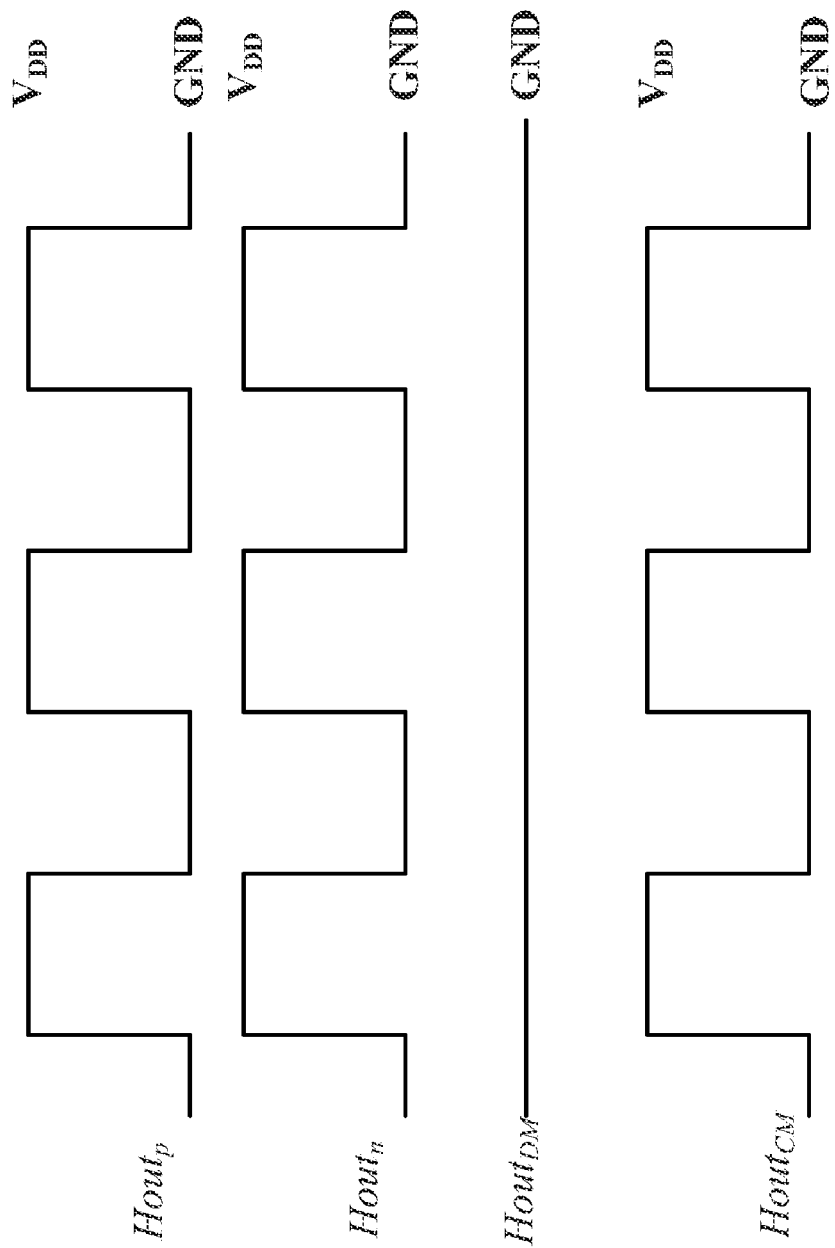
FIG. 7 highlights the specific case of a three-level PWM scheme when the input signal is zero.
Figure 8:
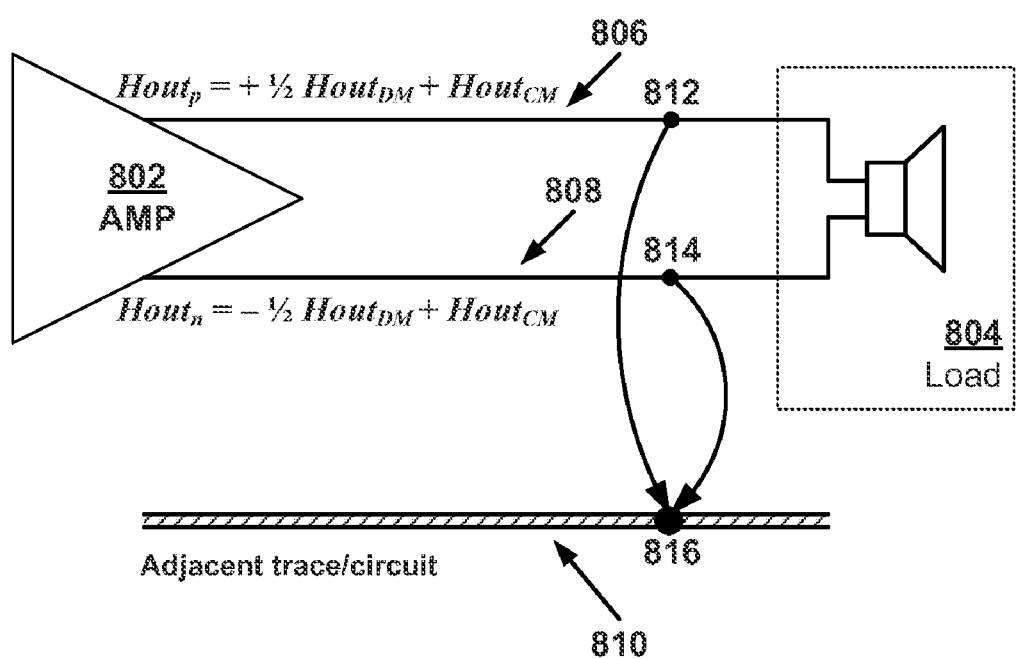
FIG. 8 illustrates how signal coupling occurs between an amplifier and another circuit.
Figure 9:
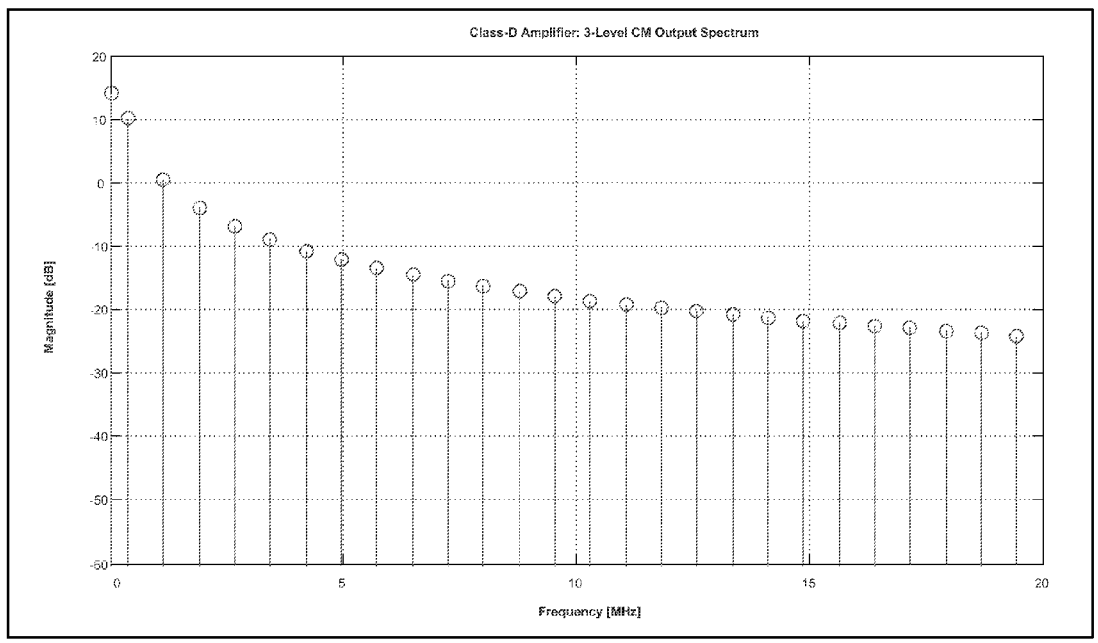
FIG. 9 shows an example three-level PWM common-mode spectrum.
Figure 10:
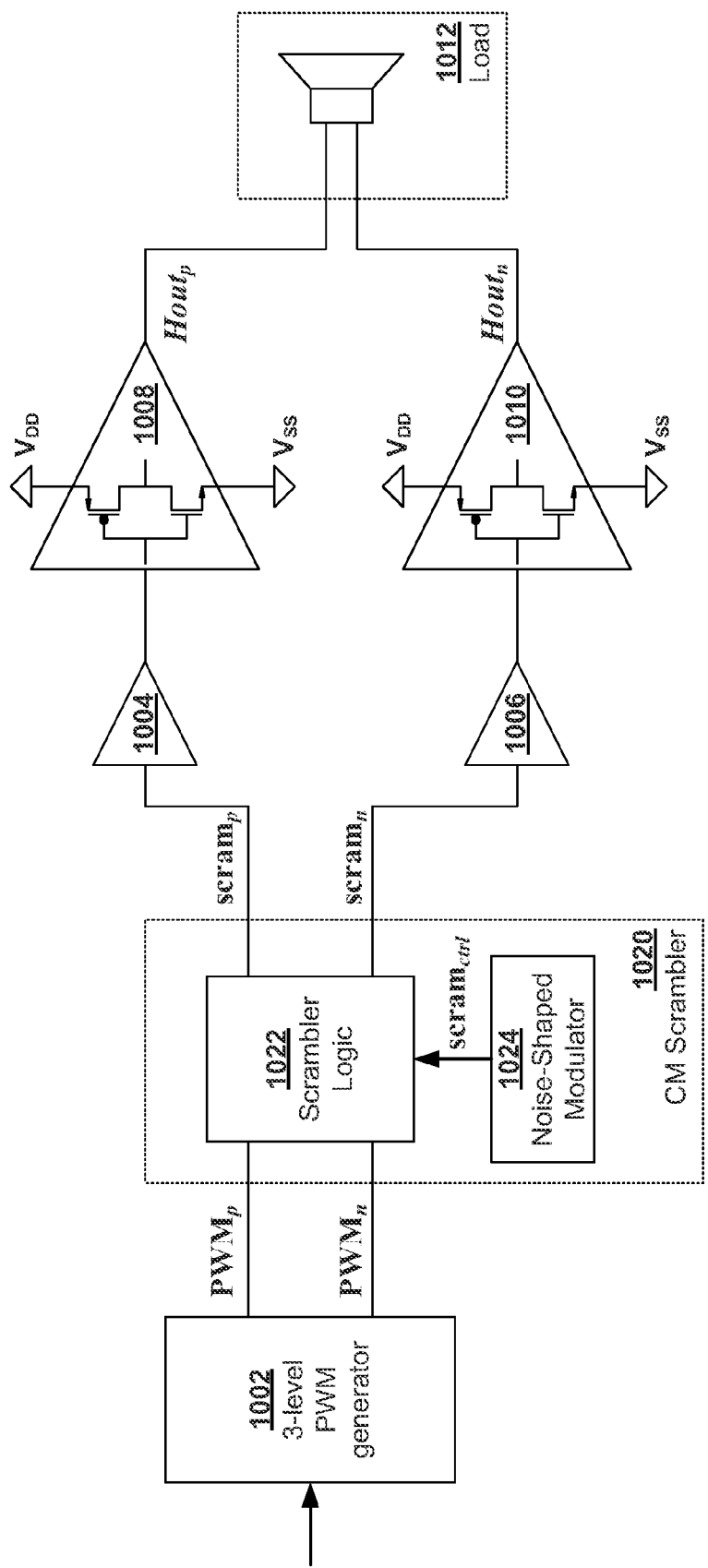
FIG. 10 is a block diagram illustrating an embodiment of the present invention.

FIG. 10 is a block diagram illustrating an embodiment of the present invention. The diagram is similar to a standard three-level PWM scheme shown in FIG. 3 except common-mode (CM) scrambler 1020 is inserted at the output of modulation circuit 1002. Like FIG. 3, modulation circuit 1002 generates two outputs $PWM_p$ and $PWM_n$. CM scrambler 1020 receives the $PWM_p$ and $PWM_n$ as two inputs and scrambles them via control signal $scram_{ctrl}$ to generate two scrambled output signals $scram_p$ and $scram_n$ which drive two half-bridge circuits 1008 and 1010 through buffers 1004 and 1006, respectively. It is convenient to refer to the inputs of CM scrambler 1020 as the p input and the n input and the outputs as the p output and the n output. Half-bridge circuit 1008 produces output $Hout_p$ and half-bridge circuit 1010 produces output $Hout_n$. The differential output signal $Hout_{DM}$ drives load 1012. A filter may optionally be placed between the half-bridge circuits and the load.

CM scrambler 1020 operates on the principle that even though the modulator circuit 1002 generates four different states, the resultant output seen at the load experiences only three states. Therefore, modulator circuit 1002 generates a redundant state. Specifically, the two states where $PWM_p$ and $PWM_n$ are equal produce the same differential output state of zero. Therefore, a scrambler circuit could interchange a [00] state for a [11] state or vice versa without affecting the differential output state. However, the switching between the [00] state and the [11] state can affect the common-mode signal.

In order to exploit these factors to control the EMI/EMC impact of the common-mode signal, CM scrambler 1020 comprises scrambler logic 1022 which receives as input $PWM_p$ and $PWM_n$ and scrambler control signal $scram_{ctrl}$ to produce scrambled signals $scram_p$ and $scram_n$. Scrambler logic 1022 can be designed with basic combinational logic which is compact and consumes negligible power. An implementation using combinational logic eliminates the need to clock scrambler logic 1022 so that transitions between the [00] and [11] states can be made asynchronous to the class-D switching clock. Furthermore, scrambler logic 1022 is controlled through control signal $scram_{ctrl}$ generated by noise-shaped modulator 1024.

One embodiment of the scrambler logic 1022 is to operate the logic in "replace mode." FIG. 11A shows a truth table of the "replace mode" scrambler logic. Whenever the incoming PWM signals are in the [01] or [10] state, the scrambled signals are permitted to remain unchanged in the [01] or [10] state, respectively. However, when the PWM signals are in the [00] or [11] state, the scrambled signals are replaced by the $scram_{ctrl}$ signal. That is, when $scram_{ctrl}$ is 1 the scrambled signals are in the [11] state and when $scram_{ctrl}$ is 0 the scrambled signals are in the [00] state. Furthermore, one of ordinary skill would recognize that a variation of the scrambler logic has the incoming signals being replaced by the logical complement of the $scram_{ctrl}$ signal rather than the $scram_{ctrl}$ signal.

Another embodiment of the scrambler logic 1022 is to operate the logic in "invert mode." FIG. 11B shows the truth table of the "invert mode" scrambler logic. Whenever the incoming PWM signals are in the [01] or [10] state, the scrambled signals are permitted to remain unchanged in the [01] or [10] state, respectively. However, whenever the PWM signals are in the [00] or [11] state, they are permitted to remain in the [00] or [11] state, respectively, if $scram_{ctrl}$ is 0, but are inverted to the [11] or [00] state, respectively, if $scram_{ctrl}$ is 1. Of course, another variation is to invert if $scram_{ctrl}$ is 0 and not to invert when $scram_{ctrl}$ is 1.

Figure 12:
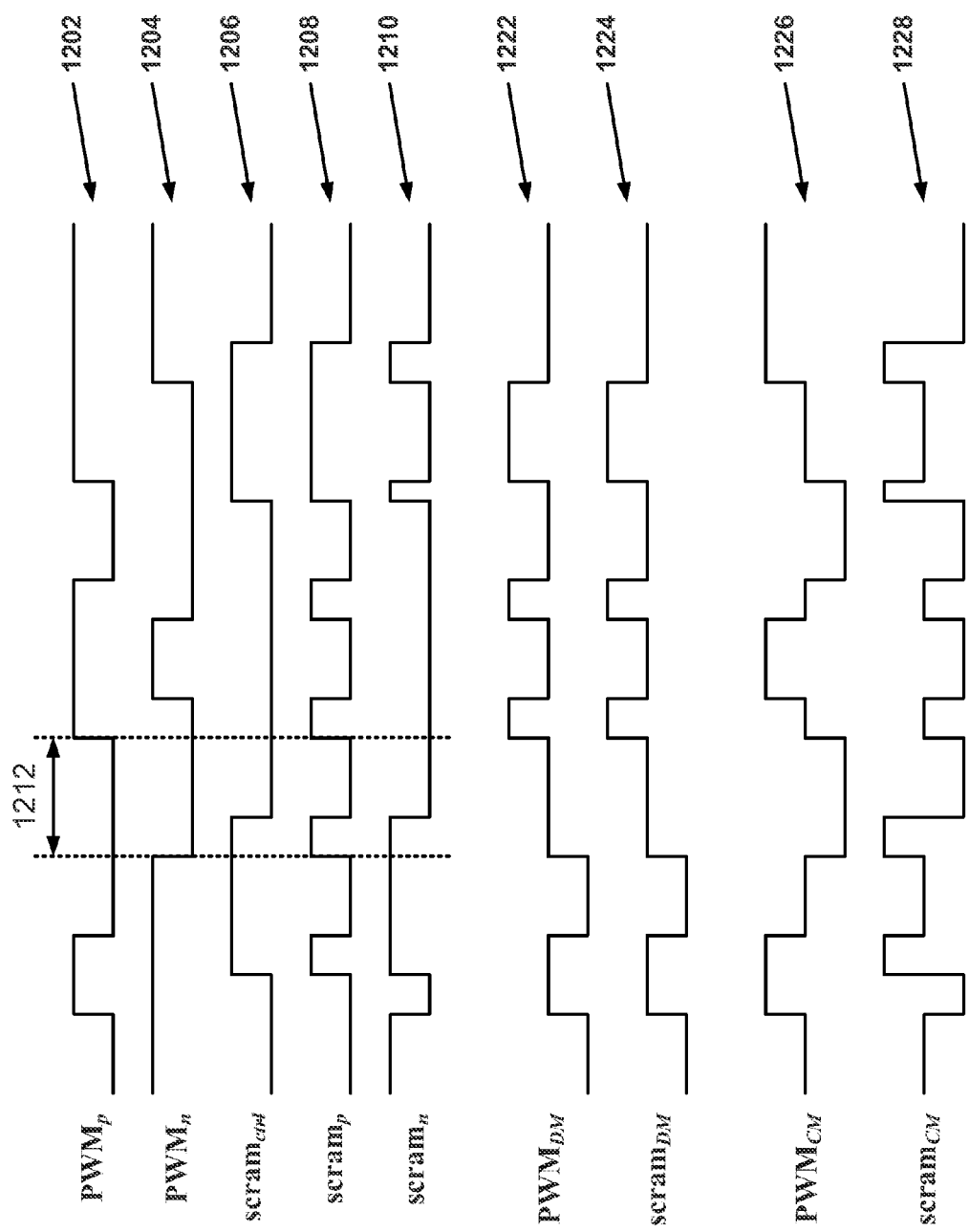
FIG. 12 shows an example of signaling using scrambler logic in replace mode.

FIG. 12 shows an example of signaling using scrambler logic in the "replace mode." Plots 1202 and 1204 illustrate an example of input PWM signals, $PWM_p$ and $PWM_n$. Plot 1206 illustrates an example of scrambler control $scram_{ctrl}$. The resulting output from the scrambler logic is shown as $scram_p$ and $scram_n$ in plots 1208 and 1210, respectively. Highlighted region 1212 shows a region of the signals where both inputs are low. In this region, the scrambled output signals take on the value of scrambler control $scram_{ctrl}$. Plots 1222 and 1224 show the differential signal for the PWM input, $PWM_{DM}$, and the scrambler output, $scram_{DM}$, respectively. Plots 1226 and 1228 show that common-mode signal for the PWM input, $PWM_{CM}$, and the scrambler output, $scram_{CM}$, respectively. This example clearly shows that the differential mode signals $PWM_{DM}$ and $scram_{DM}$ are identical while the common-mode signals $PWM_{CM}$ and $scram_{CM}$ differ. Hence, the scrambler logic can be used to manipulate the common-mode signal without affecting the differential output.

Figure 13:
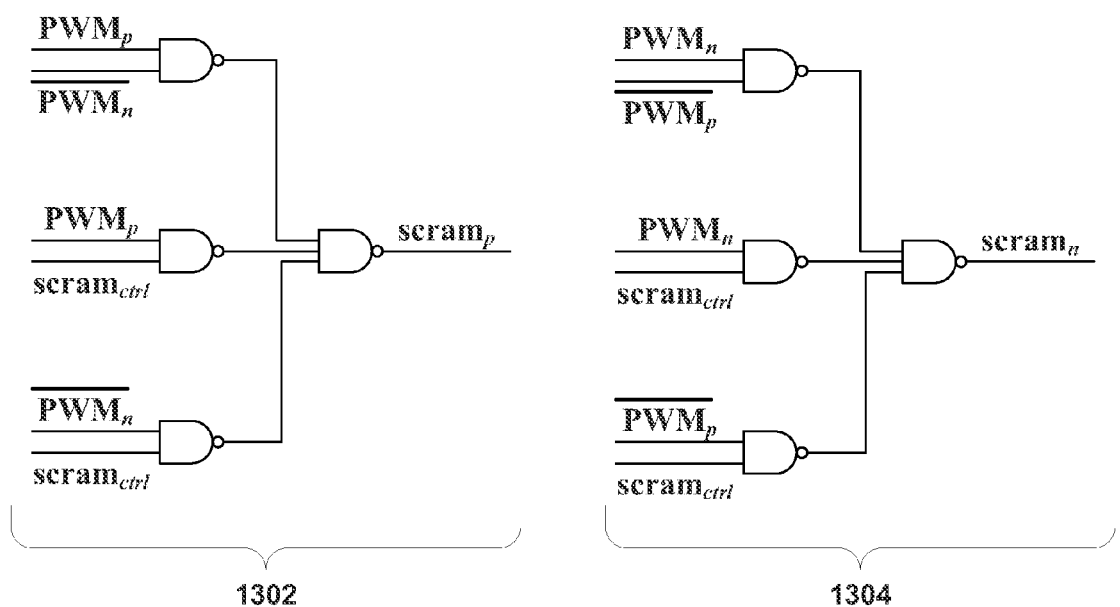
FIG. 13 shows a simple implementation of the replace mode logic.

Since PWM transitions are generally asynchronous to the class-D switching clock and can occur anywhere in the clock period, the logic block may be realized using combinational logic. FIG. 13 shows a simple implementation of the "replace mode" logic. Logic circuit 1302 shows the combinational logic that can be used to generate $scram_p$ and logic circuit 1304 shows the combinational logic that can be used to generate $scram_n$. One of ordinary skill in the art would no doubt conceive of alternate implementations that can better address possible combinational logic issues such as logic hazards and timing glitches.

In the "replace mode" implementation, the decision on how and when to change between the two states is controlled by a scrambler control signal that has to be carefully designed to address a number of practical issues. Noise shaping techniques can be used to spread out the common-mode energy while minimizing any contributions to the audio band. The control signal was created via a high-order delta-sigma modulator whose input is a DC value. Thus the entire scrambler scheme is implemented with digital gates, which results in a very robust and efficient solution.

A couple of practical issues must be considered when designing the scrambler control signal. The average common-mode value (or DC component) should be maintained since this affects the effective output biasing. To meet this goal, the DC component of the common-mode signal should be set at the midpoint between the output supply voltages, i.e. $(V_{DD}-V_{SS})/2$ in order to maximize output signal swing. This can be essentially obtained if the scrambler control signal has a uniform distribution of zeroes and ones (on average, low half of the time and high half of the time). Another goal is to reduce the power of the peaks in the common-mode spectrum by spreading the peak power at the clock harmonics into the frequency bands between the harmonics. Because there is no active suppression but merely scrambling, the total power would remain the same, but the peaks would be reduced and the overall envelope of the common-mode spectrum would be reduced. Another important objective is to prevent common-mode energy from being pushed into the audio band (0-22 kHz). While ideally the common-mode energy should not affect the audio performance, asymmetries in the system could cause some conversion of the common-mode signaling into differential signaling that could increase the audio band noise and distortion and thus degrade the dynamic range of the amplifier.

Therefore, an ideal scrambler control signal $scram_{ctrl}$ for a scrambler set to "replace" mode would have a uniform distribution of ones and zeroes as well as a spectrum such that the energy would be zero in the audio band and uniform and flat elsewhere. A one-bit digital-to-analog converter (DAC) fixed to a constant value and employing noise-shaping techniques can be applied to address these requirements.

Figure 14:
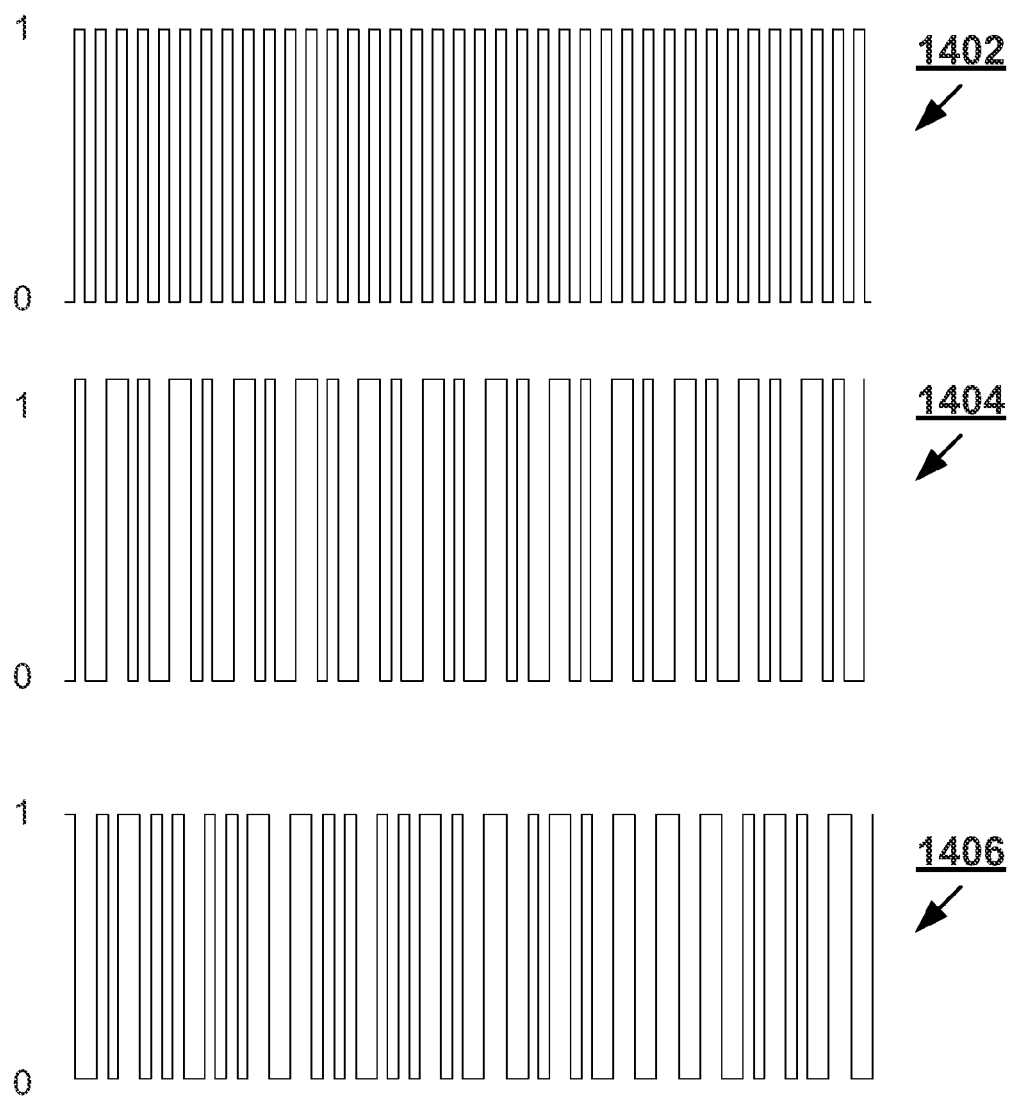
FIG. 14 illustrates different DAC outputs achieving the same DC value but different spectral content.

Noise-shaping is a technique typically used as part of the process of quantization or bit-depth reduction of a digital signal. The purpose of traditional noise shaping is to alter the spectral shape of the error produced by quantization or bit-depth reduction. FIG. 14 shows the example waveforms of different one-bit DAC implementations for the same output level. Graph 1402 gives the example of an output signal produced by a traditional pulse-density DAC without noise shaping techniques. A DC output of 0.5 is given by an output sequence of [010101] that is continually repeated. Graph 1404 shows the output of a similar DAC using a different repeating output code of [010011]. Graph 1406 shows the output produced by an example delta-sigma DAC that utilizes noise-shaping techniques; the sequence appears more "random" since the length of a repeating segment is much longer. All three of the sequences produce the same average output (0.5, as seen by the long-term equal distribution of ones and zeroes), but their spectral content beyond DC is very different. Graphs 1402 and 1404 have repetitive patterns that produce strong harmonics, while graph 1406 produces a spectrum that is shaped such that little energy is present at low frequencies and high frequency energy is spread out over a wide band.

Another issue to be addressed is that the sample rate of $scram_{ctrl}$ is limited by the class-D amplifier. The quantizer rate cannot be too high since the amplifier's output driver may not have the bandwidth to support it. A good choice is to set the sample rate at twice the class-D amplifier's switching rate. If the control signal is synchronized with the main switching clock of the class-D amplifier, the control signal will have a unique value for every half period. Also, since the control signal is a one-bit digital signal whose spectrum is to be shaped, the doubling in frequency increases the effective over-sampling rate by two, thus improving the converter's signal-to-noise performance. Additionally the converter's spectrum will be centered around half of its sample rate, which now equals the class-D switching frequency.

Delta-sigma modulators are known in the art for their noise shaping application. Delta-sigma modulators are commonly used as one-bit converters due to their ability to spread quantization noise away from the desired signal band to higher frequencies. A high-order delta-sigma modulator can give sufficient noise shaping capabilities while providing a one-bit scrambler control signal that fulfills the requirements discussed previously.

Figure 15:
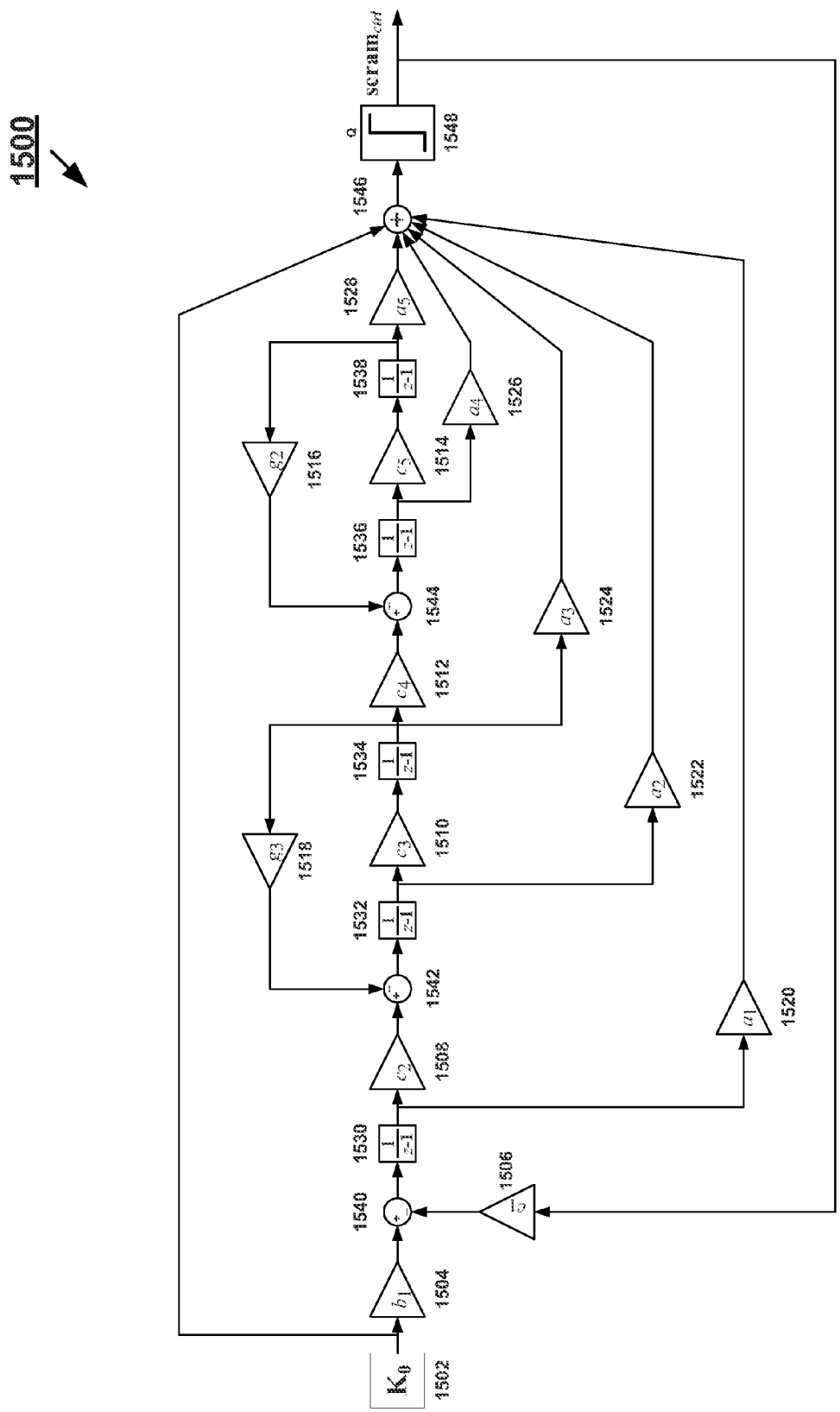
FIG. 15 illustrates an exemplary embodiment of a fifth order delta-sigma modulator.

FIG. 15 illustrates an exemplary embodiment of a fifth-order delta-sigma modulator. Input 1502 is fixed at the value $K_0$ which can be the number 0.5. However, $K_0$ may take on a different value based on the particular configuration of delta-sigma modulator 1500. Gain/attenuation elements 1504,

1506, 1508, 1510, 1512, 1514, 1516, 1518, 1520, 1522, 1524, 1526, and 1528 apply coefficients, $b_1$, $c_1$, $c_2$, $c_3$, $c_4$, $c_5$, $g_2$, $g_3$, $a_1$, $a_2$, $a_3$, $a_4$, and $a_5$, respectively to their respective data paths. Accumulators 1530, 1532, 1534, 1536, and 1538 are delayed discrete-time integrators. The various differences and sums are calculated by elements 1540, 1542, 1544, and 1546. The sum produced by element 1546 is then converted to a digital output by threshold element 1548. The specifics of the coefficient choices and the operation of this delta sigma modulator are well known in the art and omitted in this disclosure.

Figure 16A:
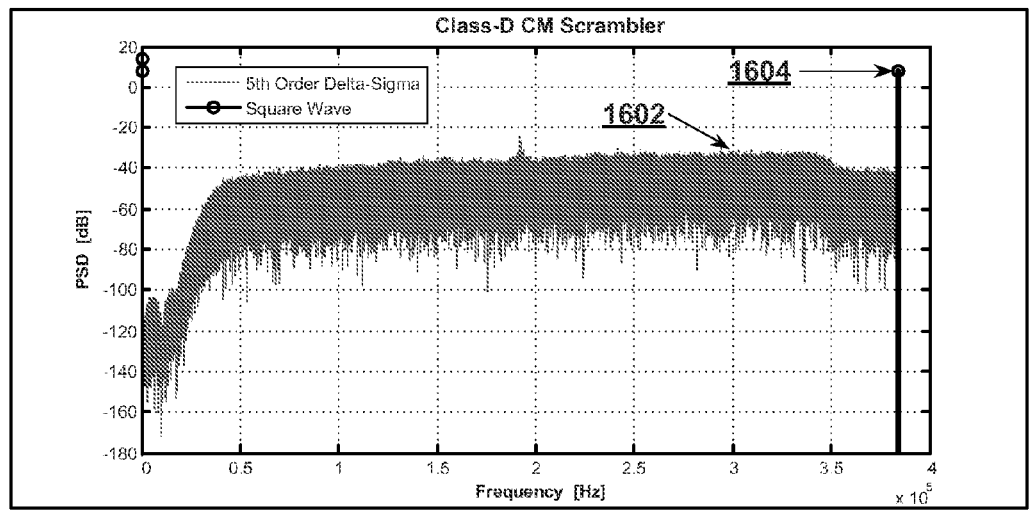
FIG. 16A shows the spectrum of the scrambler control signal that is generated by a fifth order delta-sigma modulator.
Figure 16B:
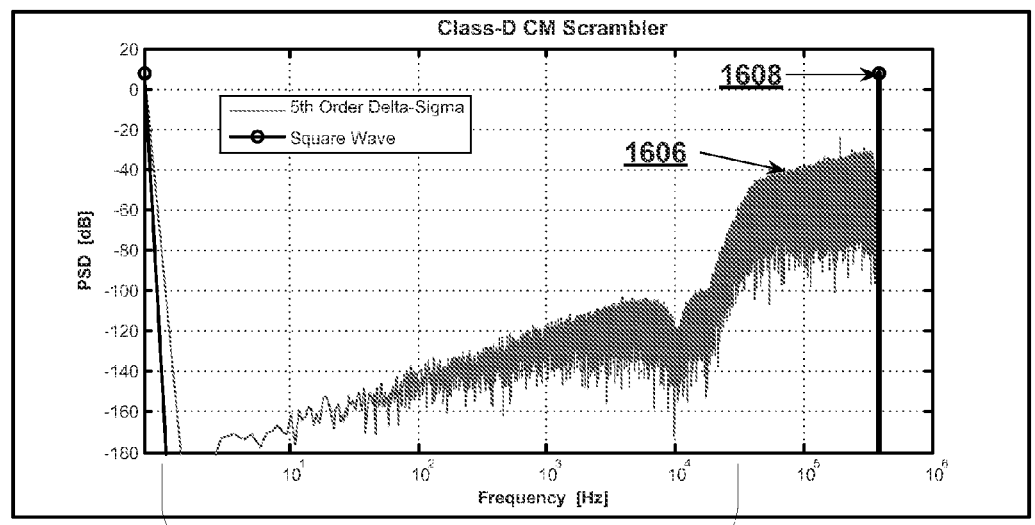
FIG. 16B shows the same graph as FIG. 16A except the frequency is presented on a logarithmic scale.

FIG. 16A shows the spectrum of a scrambler control signal, trace 1602, that is generated by a fifth-order delta-sigma modulator such as the modulator 1500. For this example, the switching frequency of the class-D amplifier is 380 kHz and the sampling frequency of the delta-sigma modulator is 760 kHz. In addition, the spectrum of a comparable 380 kHz square wave (trace 1604) is superimposed for comparison purposes; the spectrum of the square wave consists of spectral impulses at DC and odd multiples of 380 kHz. Clearly, the peak spectral power of the scrambler control signal is much lower than that of the comparable square wave. A nearly 30 dB reduction in spectral peak is seen in the example. Essentially, the power that is concentrated at 380 kHz for the square wave has been redistributed across a wider frequency band by the delta-sigma modulator. FIG. 16B illustrates the same spectrum as in FIG. 16A with the frequency axis presented on a logarithmic scale. It can clearly be seen that very little of the power exists in the audio range shown as range 1610 and most of the power has been pushed away from the audio band due to the noise shaping.

Figure 17A:
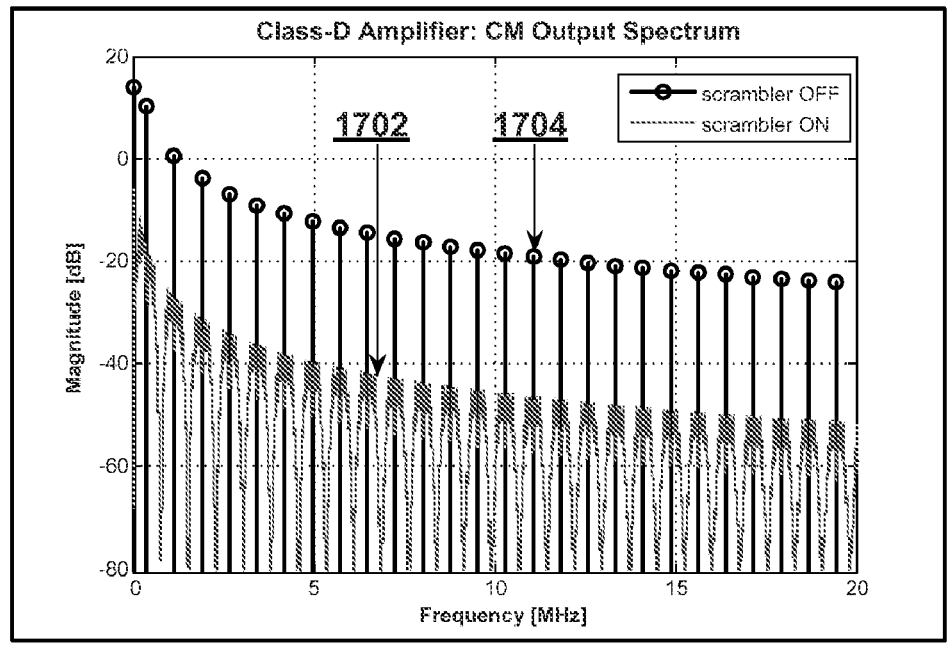
FIG. 17A shows the common-mode spectrum for a class-D amplifier.
Figure 17B:
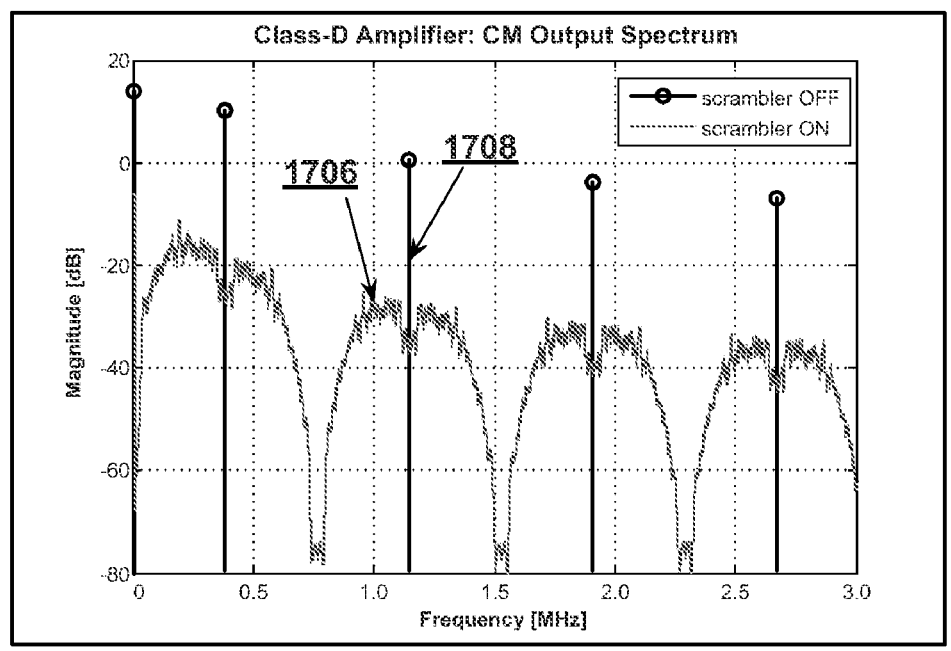
FIG. 17B shows the same common-mode spectrum as FIG. 17B except a certain frequency range is highlighted.

FIG. 17A shows the common-mode spectra of a full class-D amplifier system obtained by simulation. The solid trace 1702 shows the common-mode spectrum when the scrambler is turned on, while the trace 1704 (spectral peaks marked with circle symbols) shows the common-mode spectrum when the scrambler is turned off. FIG. 17B shows the zoomed-in view of the same common-mode spectra as in FIG. 17A over a certain frequency range. Again, the solid trace 1706 represents the common-mode spectrum when the scrambler is turned on and the circle symbol trace 1708 shows the common-mode spectrum when the scrambler is turned off. Clearly it can be seen that the common-mode peaks are significantly reduced when the scrambler is turned on and the common-mode noise is spread out over adjacent frequencies. In this simulated example, the common-mode noise peaks are suppressed by nearly 30 dB.

It should be noted that the above example for a scrambler control applies for a "replace mode" scrambler logic; a different control signal could be applied to the scrambler control if an "invert mode" scrambler logic is used instead. Also depending on other requirements of the circuit, different optimization criteria may be used for either "replace" or "invert" mode.

A class-D common-mode scrambler scheme utilizing a noise-shaped control signal can address EMI/EMC concerns by significantly reducing the amplifier's out-of-band common-mode peak spectrum. The all digital implementation described above has the benefits of being robust and compact while having low complexity and hardware cost.

The common-mode noise drawback of class-D amplifiers is addressed without adding additional components on the board, thus minimizing system costs. The entire solution is easily integrated and doesn't require accurate components or any calibration. The scrambler approach also has advantages over the spread-spectrum concepts used by others since the scrambling doesn't affect the audio signal while the spread-spectrum approach does. Furthermore, the scrambler circuitry is much simpler to implement than a good spread-spectrum clock modulator which has been employed by others in the art.

It should be emphasized that the above described embodiments are merely examples of possible implementations. Many variations and modifications may be made to the above described embodiments without departing from the principles of the present disclosure. For example, while the embodiments are described within the context of a class-D amplifier, the principles and improvements outlined in this disclosure could be applicable to any system utilizing a three-level PWM modulator. All such modifications and variations are intended to be included herein within the scope of this disclosure and protected by the following claims.

The invention claimed is:

1. A circuit comprising:
a common mode scrambler circuit comprising:
a p input receiving a p input signal and an n input receiving an n input signal, wherein the p input signal and the n input signal is either in a low state or a high state;
a p output transmitting a p output signal and an n output transmitting an n output signal, wherein the p output signal and the n output signal is either in a low state or a high state; and
scrambler logic circuitry configured to receive a scrambler control signal which is either in a low state or a high state,
wherein when the p input signal and the n input signal are in different states, the scrambler logic circuitry causes the p output signal to be in the same state as the p input signal and causing the n output signal to be in the same state as the n input signal, and
wherein when the p input signal and the n input signal are in the same state, the scrambler logic circuitry generates the p output signal and the n output signal as a function of at least the scrambler control signal.

2. The circuit of claim 1 wherein when the p input signal and the n input signal are in the same state, the scrambler logic circuitry causes the p output signal to be in the high state and the n output signal to be in the high state when the scrambler control signal is in the high state and causes the p output signal to be in the low state and the n output signal to be in the low state when the scrambler control signal is in the low state.

3. The circuit of claim 1 wherein when the p input signal and the n input signal are in the same state, the scrambler logic circuitry causes the p output signal to be in the same state as the p input signal and the n output signal to be in the same state as the n input signal when the scrambler control signal is in the low sate and causes the p output signal to be in the inverse state of the p input signal and the n output signal to be in the inverse state of the n input signal when the scrambler control signal is in the high state.

4. The circuit of claim 1 further comprising:
a 3-level PWM generator having a $PWM_p$ output and a $PWM_n$ output;
a first half bridge circuit driven by the p output signal; and
a second half bridge circuit driven by the n output signal, wherein the p input signal is received from the $PWM_p$ output and the n input signal is received from the $PWM_n$ output.

5. The circuit of claim 1, further comprising a noise shaping circuit configured to send the scrambler control signal to the common-mode scrambler circuit.

6. The circuit of claim 5, wherein the noise shaping circuit comprises a delta-sigma modulator.

7. The circuit of claim 6, wherein the delta-sigma modulator is a $k^{th}$-order delta-sigma modulator, where k is greater than 4.

8. The circuit of claim 1 further comprising:
a first buffer between the common-mode scrambling circuit and the first half-bridge circuit and
a second buffer between the common-mode scrambling circuit and the second half-bridge circuit.

9. The circuit of claim 1 further comprising:
a low pass filter.

10. A method for scrambling outputs of a three-level PWM generator comprising:
receiving a $PWM_p$ signal and a $PWM_n$ signal from the three-level PWM generator, wherein the $PWM_p$ signal and the $PWM_n$ signal is either in a low state or a high state;
receiving a scrambler control signal which is either in a low state or a high state;
generating a p output signal and an n output signal;
wherein when the $PWM_p$ signal and the $PWM_n$ signal are in different states, the p output signal is set to the same state as the $PWM_p$ signal and the n output signal is set to the same state as the $PWM_n$ signal, and
wherein when the $PWM_p$ signal and the $PWM_n$ signal are in the same state, the p output signal and the n output signal are a function of at least the scrambler control signal.

11. The method of claim 10 wherein when the $PWM_p$ signal and the $PWM_n$ signal are in the same state, the p output signal and the n output signal are both set to the same state as the scrambler control signal.

12. The method of claim 10 wherein when the $PWM_p$ signal and the $PWM_n$ signal are in the same state, the p output signal and the n output signal are set to the same state as the $PWM_p$ signal when the scrambler control signal is in the low state, and the p output signal and the n output signal are set to the inverse state of the $PWM_p$ signal when the scrambler control signal is in the high state.

13. The method of claim 10, further comprising:
generating the scrambler control signal with a noise shaping circuit.

14. The method of claim 13, wherein the noise shaping circuit comprises a delta-sigma modulator.

15. The method of claim 10, further comprising
generating the $PWM_p$ signal and the $PWM_n$ signal by a three-level PWM generator;
driving a first half-bridge circuit by the p output signal;
driving a second half-bridge circuit by the n output signal.

16. A circuit comprising:
a common-mode scrambler circuit comprising:
a p input receiving a p input signal and an n input receiving an n input signal, wherein the p input signal and the n input signal is either in a low state or a high state;
a p output transmitting a p output signal and an n output transmitting an n output signal, wherein the p output signal and the n output signal is either in a low state or a high state; and
means for scrambling the p input signal and the n input signal to produce signals at the p output signal and n output signal;
wherein when the p input signal and the n input signal are in different states, the means for scrambling causes the p output signal to be in the same state as the p input signal and causes the n output signal to be in the same state as the n input signal, and
wherein when the p input signal and the n input signal are in the same state, the means for scrambling generates the p output signal and the n output signal as a function of at least the scrambler control signal.

17. The circuit of claim 16 wherein when the p input signal and the n input signal are in the same state, the means for scrambling causes the p output signal to be in the high state and the n output signal to be in the high state when the scrambler control signal is in the high state and causes the p output signal to be in the low state and the n output signal to be in the low state when the scrambler control signal is in the low state.

18. The circuit of claim 16 further comprising:
means for generating a first PWM signal for the p input;
means for generating a second PWM signal for the n input;
means for amplifying the p output; and
means for amplifying the n output.

19. The circuit of claim 16, further comprising noise shaping means for generating the scrambler control signal.

20. The circuit of claim 16, further comprising:
means for low pass filtering.

* * * * *